United States Patent
Van Den Brink

(10) Patent No.: US 10,948,561 B2
(45) Date of Patent: Mar. 16, 2021

(54) SUBSEQUENT MRI CONFIGURATION DEPENDENT EDDY CURRENT COMPENSATION

(71) Applicant: KONINKLIJKE PHILIPS N.V., Eindhoven (NL)

(72) Inventor: Johan Samuel Van Den Brink, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 120 days.

(21) Appl. No.: 16/070,800

(22) PCT Filed: Jan. 16, 2017

(86) PCT No.: PCT/EP2017/050739
§ 371 (c)(1),
(2) Date: Jul. 18, 2018

(87) PCT Pub. No.: WO2017/125329
PCT Pub. Date: Jul. 27, 2017

(65) Prior Publication Data
US 2019/0025398 A1  Jan. 24, 2019

(30) Foreign Application Priority Data
Jan. 22, 2016 (EP) .................................. 16152337

(51) Int. Cl.
*G01R 33/565* (2006.01)
*G01R 33/28* (2006.01)
*G01R 33/54* (2006.01)

(52) U.S. Cl.
CPC ..... *G01R 33/56518* (2013.01); *G01R 33/283* (2013.01); *G01R 33/543* (2013.01)

(58) Field of Classification Search
CPC ............ G01R 33/56518; G01R 33/283; G01R 33/543
See application file for complete search history.

(56) References Cited

U.S. PATENT DOCUMENTS

| 10,823,794 B2 | 11/2020 | Shvartsman et al. |
| 2008/0204024 A1* | 8/2008 | Gao .................... G01R 33/3806 324/318 |
| 2009/0212772 A1 | 8/2009 | Ookawa |

(Continued)

FOREIGN PATENT DOCUMENTS

| EP | 0216523 A2 | 4/1987 |
| EP | 2515132 A1 | 10/2012 |
| JP | 2005270303 A | 10/2005 |

OTHER PUBLICATIONS

Xu et al "Correcting High Order Eddy Current Induced Distortion for Diffusion Weighted Echo Planar Imaging" Proceedings of the Int. Soc. Form Magnetic Resonance in Imaging, May 7, 2011, p. 4564.

(Continued)

*Primary Examiner* — Tung X Nguyen
*Assistant Examiner* — Feba Pothen

(57) ABSTRACT

A magnetic resonance imaging system (10) includes a magnetic gradient coil system (22) configured for generating gradient magnetic fields by providing a predetermined temporal electrical current profile to at least one magnetic gradient coil in accordance with a desired magnetic resonance examination mode. An additional device (50), which is not part of the original magnetic resonance imaging system (10) is positioned within an inner region (44) of the magnetic resonance imaging system (10) for special examination or other purposes. The additional device (50) is capable of generating an eddy current in at least a portion of the additional device (50) when exposed to the generated gradient magnetic field. The magnetic resonance imaging (Continued)

system (10) is configured for modifying the predetermined electrical current profile at least on the basis of at least one predetermined parameter set upon receipt of an information indicative of a presence of at least one additional device (50) within an inner region (44) of the magnetic resonance imaging system (10).

9 Claims, 3 Drawing Sheets

(56) References Cited

U.S. PATENT DOCUMENTS

2012/0229139 A1    9/2012  Yamanaka
2013/0172729 A1*   7/2013  Kocaturk ........... G01R 33/3657
                                                      600/411

OTHER PUBLICATIONS

Lechner-Greite et al "The Role of Eddy Currents in EPI Thermometry for Transcranial MR Guided Focused Ultrasound" Proceedings of the International Society for Magnetic Resonance in Med. May 5, 2012, p. 1583.
Graf et al "Gradient Switching Induced Artifacts Near Metal Parts" Proceedings of the International Soc. for Magnetic Resonance in Med., May 7, 2005 p. 2277.
Lechner-Greite et al "Impact of Gradient Induced Eddy Currents on Multi-Shot EPI-Based Tempeature Map Accuracy in a Transcranial MR Guided Focused Ultrasound Applicator" 23rd ISMRM Annual Meeting May 30-Jun. 5, 2015.

* cited by examiner

SUBSEQUENT MRI CONFIGURATION DEPENDENT EDDY CURRENT COMPENSATION

CROSS REFERENCE TO RELATED APPLICATIONS

This application is a U.S. national phase application of International Application No. PCT/EP2017/050739, filed on Jan. 16, 2017, which claims the benefit of EP Application Serial No. 16152337.8 filed on Jan. 22, 2016 and is incorporated herein by reference.

FIELD OF THE INVENTION

The invention pertains to a magnetic resonance imaging system with eddy current correction, and a method of operating the magnetic resonance imaging system with regard to generating a gradient magnetic field.

BACKGROUND OF THE INVENTION

In the field of magnetic resonance (MR) examination it is known that time-varying magnetic fields that are intentionally generated by gradient coils of an MR imaging system can generate undesired eddy currents in electrically conductive objects that are part of the MR imaging system.

As one effect, the generated eddy currents themselves in turn generate magnetic fields that may cause serious problems in MR imaging and may result in image distortions, ghosting effects, unreliable water-fat separation, and may affect quantitative parameter evaluations such as q-flow. The eddy currents are therefore usually characterized and compensated for the MR imaging system, and at a limited field of view (FOV).

For instance, patent application US 2012/0229139 A1 describes an MR imaging apparatus including a storage unit, an eddy current correcting unit and a gradient magnetic field power supply. The storage unit stores therein eddy current correction parameters that each correspond to the imaging positions to correct the influence of an eddy current magnetic field. The eddy current correcting unit receives the waveform of the gradient magnetic field calculated in accordance with the imaging condition, performs calculation onto the received waveform of the gradient magnetic field by use of an eddy current correction parameter selected in accordance with the position, and outputs the corrected waveform obtained as the calculation result to the gradient magnetic field power supply. The gradient magnetic field power supply receives the corrected waveform and applies a gradient magnetic field in accordance with the corrected waveform. Xu, et al., "Correcting High Order Eddy Current Induced Distortion for Diffusion-Weighted Echo Planar Imaging", Proc. of Int'l Soc. for Mag. Res. in Imaging, May 7, 2011, page 4564, discloses to compensate compensating for certain high order eddy currents (HOECs) by adjusting the encoding gradients. More in particular, Xu, et al. concerns diffusion-weighted EPI acquisition which suffers from direction dependent distortions due the diffusion gradients generated eddy currents. An observation in Xu, et al. is that the disturbance may be slice dependent as well. To resolve the disturbance, the gradient waveform is modified on a slice-by-slice basis and further correct the distorted images by post processing (to correct for so-called type-II terms). The waveforms are modified on the basis of an evaluation of phase differences between images of the diffusion direction but for opposite polarities on a per slice basis.

SUMMARY OF THE INVENTION

The time-varying magnetic fields intentionally generated by gradient coils of an MR imaging system can generate undesired eddy currents in electrically conductive objects that are not part of the original MR imaging system as such, and that have been positioned within the MR imaging system for special examination purposes. The described undesired eddy current effects can vary significantly when an electrically conductive object that is not a part of the original MR imaging system is present within the MR imaging system. For distinction purposes, a device that is not part of the original MR imaging system as such, and that has been positioned within the MR imaging system for special examination or other purposes, will be referred to as an "additional device" in the following.

Numerous potential additional devices are contemplated including, but not limited to, abdomen focused ultrasound surgery (FUS) device, breast FUS device, brain FUS device, brain stereotactic frame device and prostate biopsy device.

It is therefore an object of the invention to provide eddy current compensation for specific configurations of one or more additional devices that have been positioned within the MR imaging system.

In one aspect of the present invention, the object is achieved by a magnetic resonance (MR) imaging system comprising a magnetic gradient coil system including at least one magnetic gradient coil and at least one magnetic gradient coil driver unit for providing a predetermined temporal electrical current profile to the at least one magnetic gradient coil in accordance with a desired magnetic resonance examination mode, and a magnetic gradient coil control unit that is configured for controlling the at least one magnetic gradient coil driver unit.

The magnetic gradient coil system is configured for generating gradient magnetic fields to be superimposed to a static magnetic field $B_0$ of the magnetic resonance imaging system. An inner region of the MR imaging system is defined by a predetermined maximum distance to an outer surface of a smallest virtual cylinder that envelops the at least one magnetic gradient coil.

Further, the MR imaging system includes a digital data storage unit comprising a plurality of predetermined parameter sets that are usable for modifying the predetermined temporal electrical current profile. The MR imaging system is configured for modifying the predetermined electrical current profile at least on the basis of at least one predetermined parameter set of the plurality of predetermined parameter sets upon receipt of an information indicative of a presence of at least one additional device within the inner region, wherein the additional device is capable of generating an eddy current in at least a portion of the additional device when being exposed to the generated gradient magnetic field.

The predetermined parameter sets each modify the temporal electrical current profile to compensate for the eddy current effects caused by the additional device for its position and orientation. An insight of the present invention is that the predetermined parameter sets may be appropriately represented by the position and/or orientation of the additional device. Accordingly, upon receipt of the position and/or orientation of the additional device, the appropriate predetermined parameter set may be selected and applied to modify the temporal electrical current profile.

The phrase "being configured to", as used in this application, shall in particular be understood as being specifically programmed, laid out, furnished or arranged. The term "cylinder", as used in this application, shall in particular be understood as any ruled surface that is generated by translating a closed base line of the cylinder that is lying in a plane, by a fixed distance that is arranged in a direction outside the plane, and shall in particular encompass elliptical and circular cylinders as well as prisms having a substantially polygonal cross-sectional area.

The phrase "substantially polygonal cross-sectional area", as used in this application, shall in particular be understood such that a difference between the cross-sectional area of the cylinder and a smallest area of a polygon having the same number of straight sides as the cross-section of the cylinder and that fully encases the cross-sectional area of the cylinder is less than 20%, more preferable less than 10%, of the cross-sectional area of the cylinder.

The phrase "presence of an additional device within the inner region", as used in this application, shall in particular be understood that at least the portion of the additional device in which an eddy current can be generated when being exposed to the generated gradient magnetic field is arranged within the inner region.

In this way, an MR imaging system with an eddy current correction can be provided which, besides an eddy current correction for components of the original MR imaging system also accounts for additional devices that have been positioned within the MR imaging system, and that are subject to eddy current generation when being exposed to the generated gradient magnetic field.

In particular, a real-time eddy current correction can be enabled in this way.

In a preferred embodiment, the MR imaging system further includes a human interface device, wherein the information regarding a presence of at least one additional device within the inner region is provided to a control unit of the magnetic resonance imaging system, for instance to the magnetic gradient coil control unit, via the human interface device. By that, an eddy current correction that accounts for an additional device that is intended to be used within the inner region during an MR imaging examination can readily be initiated by a user or operator of the MR imaging system.

The human interface device may be selected from a group including but not limited to computer mouse, keyboard, joystick, touchscreen, microphone in combination with voice recognition method and optical camera with gesture recognition method.

In another preferred embodiment, the MR imaging system further includes at least one detection means that is configured for detecting a presence of an additional device within the inner region, and is further configured for providing the information regarding the presence of an additional device within the inner region upon detecting the presence to a control unit of the magnetic resonance imaging system, for instance to the magnetic gradient coil control unit.

In this way, an eddy current correction for additional devices that have been positioned within the MR imaging system, and that are subject to eddy current generation when being exposed to the generated gradient magnetic field, can beneficially be initiated in an automatic manner without being subject to human error.

Numerous employable detection means are well known to those skilled in the art, amongst them but not limited to are RFIDs, electrical switches and electrical contacts that change their switching status or connection status, respectively, upon positioning the additional device. Any detection means that appears to be suitable to those skilled in the art may be employed.

Preferably, the at least one detection means is configured to determine at least one out of a position and an orientation of the additional device or the additional devices relative to the inner region, which can enable applying a dedicated eddy current correction that is specific not only to the additional device but also to a position and/or an orientation of the additional device, and, by that, facilitating a use of the additional device in different positions and/or orientations during MR imaging examination. Notably, the position and/or orientation of the additional device relative to the inner region includes the position and/or orientation of the additional device within the inner region, i.e. in the co-ordinate framework of the inner region.

In some embodiments, the at least one detection means is formed by an optical camera. In a suitable embodiment and employing one of readily available, for instance commercial image recognition software packages, the additional device itself and its position and/or orientation relative to the inner region can readily be derived.

Preferably, each one of the predetermined parameter sets includes at least one out of a parameter set comprising an eddy current amplitude and an eddy current decay time constant and a parameter set that is representative of a gradient impulse response function.

The first parameter set characterizes a response of the additional device for a specific frequency range of the generated gradient magnetic fields, the latter parameter set defines a response of the additional device for all frequencies. By any one of the two parameter sets, a response of the additional device to time-varying magnetic fields intentionally generated by gradient coils of the MR imaging system can be readily calculated and used for modifying the predetermined electrical current profile to accomplish an eddy current correction that is specific to the additional device.

Preferably, each one of the predetermined parameter sets is uniquely correlated to a data set that is indicative of the at least one additional device and at least one out of a position and an orientation of the additional device relative to the inner region.

The phrase "data set that is indicative of the at least one additional device", as used in this application, shall in particular be understood to encompass any information that is suitable to characterize at least one out of the nature, the specific type, specific physical dimensions and specific material properties of the at least one additional device.

In another aspect of the present invention, a method of operating an MR imaging system with regard to generating a gradient magnetic field is provided. The method includes steps of:

selecting a predetermined electrical current profile to be provided to at least one magnetic gradient coil in accordance with a desired MR examination mode;

checking for receipt of information regarding a presence of an additional device within an inner region of the MR imaging system that is defined by a predetermined maximum distance to an outer surface of a virtual cylinder that envelops the at least one magnetic gradient coil;

providing the predetermined electrical current profile to the at least one magnetic gradient coil if a result of the checking turns out to be negative;
if a result of the checking turns out to be positive,
based on the received information, selecting a predetermined parameter set out of a plurality of predetermined parameter sets;
modifying the predetermined electrical current profile by using the selected predetermined parameter set; and
providing the modified electrical current profile to the at least one magnetic gradient coil.

A real-time eddy current correction can be enabled in this way. The information regarding a presence of an additional device or the additional devices may be provided by a user or operator input to the MR imaging system, or it may be automatically be provided by a detection means of the MR imaging system.

In a preferred embodiment of the method, the step of checking for receipt of information comprises checking for at least one out of information regarding the position of the additional device or the additional devices relative to the inner region, the orientation of the additional device or the additional devices relative to the inner region and of information indicating at least one out of a type and a nature of the additional device or the additional devices. In this way, a dedicated eddy current correction that is specific to the additional device and to a position and/or an orientation of the additional device relative to the MR imaging system can be enabled.

In some embodiments, the method further comprises preceding calibration steps of:
positioning an additional device within the inner region of the magnetic resonance imaging system;
determining at least one out of a position of the additional device relative to the inner region and an orientation of the additional device relative to the inner region;
generating a gradient magnetic field by providing a predetermined electrical current profile to a magnet gradient coil or magnetic gradient coils of the magnetic resonance imaging system;
characterizing an eddy current response to the generated gradient magnetic field;
determining an eddy current parameter set that is representative of the characterizing of the eddy current response;
storing the determined eddy current parameter set, the position of the additional device, the relative orientation and data indicative of the additional device as a predetermined parameter set in a digital data storage unit.

By that, a database of predetermined parameter sets can be provided that enables a configuration-specific eddy current correction for a large number of additional devices employable in an MR imaging examination, and in particular can enable a real-time configuration-specific eddy current correction.

In some embodiments of the method, the step of characterizing the eddy current response includes steps of
positioning a set of magnetic resonance-active samples within the inner region;
applying a magnetic resonance imaging procedure; and
the step of determining the eddy current parameter set includes evaluating the magnetic resonance signals obtained by the applied MR imaging procedure.

In this way, a preceding calibration can readily be executed and the predetermined parameter set for an eddy current correction can quickly be provided by applying a standard MR imaging examination.

The set of magnetic resonance-active samples may be part of a nowadays commercially available dynamic magnetic field camera that is employable for spatio-temporal magnetic field measurements. Such a dynamic magnetic field camera is, for instance, described in European patent application EP 2 515 132 A1.

It is another aspect of the present invention to provide a software module for carrying out an embodiment of the disclosed method of operating a magnetic resonance imaging system with regard to generating a gradient magnetic field. The method steps to be conducted are converted into a program code of the software module. The program code is implementable in a digital data memory unit of an MR imaging system and is executable by a processor unit of the MR imaging system. The processor unit may be the processor unit of a control unit that is customary for controlling functions of the MR imaging system. The processor unit may, alternatively or supplementary, be another processor unit that is especially assigned to execute at least some of the method steps.

The software module can enable a robust and reliable execution of the method and can allow for a fast modification of method steps if required.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
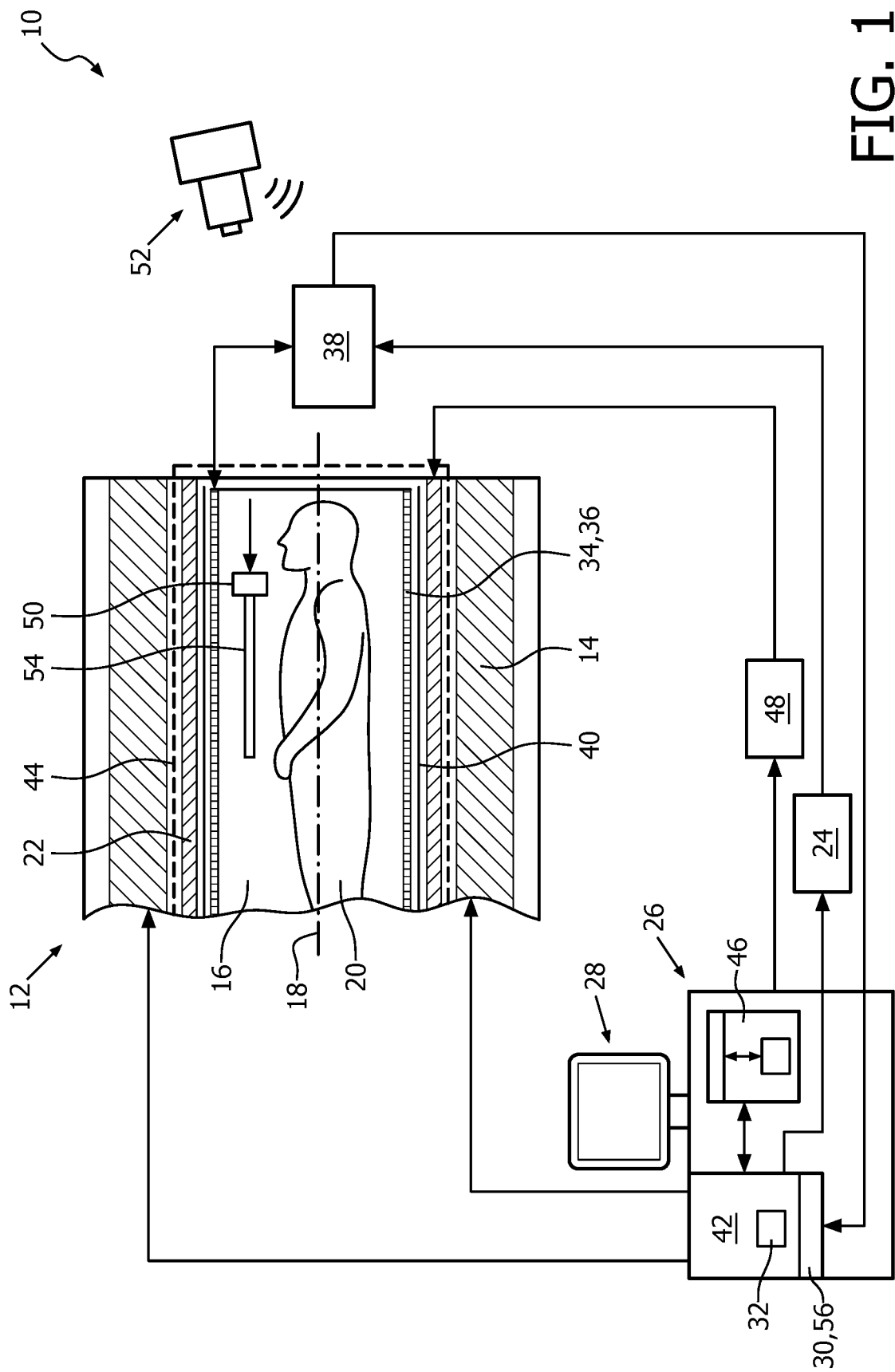
FIG. 1 shows a schematic illustration of a part of an embodiment of a magnetic resonance examination system in accordance with the invention.

FIG. 1 shows a schematic illustration of a part of an embodiment of a magnetic resonance imaging system 10 in accordance with the invention. The magnetic resonance imaging system 10 is configured for acquiring magnetic resonance images from at least a portion of a subject of interest 20, usually a patient. The magnetic resonance imaging system 10 comprises a scanner unit 12 having a main magnet 14. The main magnet 14 has a central bore that provides an examination space 16 around a center axis 18 for the subject of interest 20 to be positioned within at least during examination, and is further configured for generating a static magnetic field $B_0$ of appropriate magnetic field strength at least in the examination space 16. For clarity reasons, a customary table for supporting the subject of interest 20 is omitted in FIG. 1. The static magnetic field $B_0$ defines an axial direction that is usually denoted as the direction of the z-axis of a Cartesian coordinate system and is aligned in parallel to the center axis 18 of the examination space 16.

Although this specific embodiment is described as a bore-type magnetic resonance imaging system, it will readily be appreciated by those skilled in the art that the invention is also applicable to other types of magnetic resonance imaging systems.

The magnetic resonance imaging system 10 comprises a control unit 26 provided to control functions of the scanner unit 12 and other functions of the magnetic resonance imaging system 10. The control unit 26 includes a digital data storage unit 30, a processor unit 32 having data access to the digital data storage unit 30 and a human interface device 28 provided for transferring information between the control unit 26 and an operator, usually a medical staff member.

Furthermore, the magnetic resonance imaging system 10 includes a radio frequency antenna device 34 designed as a whole-body coil that is configured for applying a radio frequency excitation field $B_1$ to nuclei of or within the subject of interest 20 for magnetic resonance excitation during radio frequency transmit time periods to excite the nuclei of or within the subject of interest 20 for the purpose of magnetic resonance imaging. To this end, radio frequency power is fed, controlled by the control unit 26, from a radio frequency transmitter unit 24 to the whole-body coil. The whole-body coil has a center axis and, in an operational state, is arranged concentrically within the bore of the main magnet 14 such that the center axis of the whole-body coil and the center axis 18 of the examination space 16 coincide. As is common in the art, a cylindrical metal radio frequency shield 40 is arranged concentrically around the whole-body coil.

The whole-body coil is also configured as a radio frequency antenna device 36 for receiving magnetic resonance signals during radio frequency receive phases from the nuclei of or within the portion of the subject of interest 20 that have been excited by applying the radio frequency excitation field $B_1$. In the operational state of the magnetic resonance imaging system 10, radio frequency transmit phases and radio frequency receive phases are taking place in a consecutive manner.

The radio frequency transmitter unit 24 is configured to feed pulses of radio frequency power of a magnetic resonance radio frequency to the whole-body coil via a radio frequency switching unit 38 during the radio frequency transmit phases. During the radio frequency receive phases, the radio frequency switching unit 38, controlled by the control unit 26, directs the magnetic resonance signals from the whole-body coil to a signal processing unit 42 residing in the control unit 26. The signal processing unit 42 is configured for processing magnetic resonance signals to determine images of at least the portion of the subject of interest 20 from the acquired magnetic resonance signals.

Further, the magnetic resonance imaging system 10 comprises a magnetic gradient coil system 22 configured for generating gradient magnetic fields to be superimposed to the static magnetic field $B_0$. The gradient coil system 22 comprises two pairs of gradient coils of the well-known saddle-type for generating transverse gradient magnetic fields in the x-direction $$\left(\frac{\partial B_z}{\partial x}\right)$$

and in the y-direction $$\left(\frac{\partial B_z}{\partial y}\right),$$

and one pair of gradient coils arranged in the well-known Helmholtz configuration for generating a gradient magnetic field in the z-direction $$\left(\frac{\partial B_z}{\partial z}\right).$$

The gradient coil system 22 further includes a magnetic gradient coil driver unit 48 that is controlled by a magnetic gradient coil control unit 46 that forms part of the control unit 26, and is configured for providing predetermined temporal electrical current profiles to the gradient coils. The temporal electrical current profiles are provided in the form of gradient pulse sequences that are selectable in accordance with a desired magnetic resonance examination mode, and are synchronized with the radio frequency transmit phases and radio frequency receive phases.

An inner region 44 of the magnetic resonance imaging system 10 is defined by a predetermined maximum distance to an outer surface of a smallest virtual cylinder that envelops the magnetic gradient coils.

In this specific embodiment, the magnetic resonance imaging system 10 is used for guiding an additional device 50 designed as a focused ultrasound (FUS) therapy device. The FUS therapy device is utilized as a hyperthermia device for depositing energy in a target zone of the subject of interest 20 in order to activate tissue for improved response to e.g. chemotherapy. The FUS therapy device comprises an ultrasound transducer probe 54 having a rod with an acceptance member arranged in a portion of the rod that includes an end that is distal to a user. The acceptance member is formed as a slot, which in an operational state is configured for containing an ultrasound transducer array. The ultrasound transducer probe 54, upon activation, is configured to apply a focused ultrasound beam of an ultrasound frequency, from the ultrasound transducer array to adjacent tissue within the subject of interest 20. The ultrasound transducer array is powered by an electric power unit (not shown) that is controlled by the control unit 26. The operation of such FUS therapy device is well known in the art and therefore need not be described in more detail herein.

In order to apply the FUS therapy device it is required to position the ultrasound transducer probe 54 within the inner region 44. The ultrasound transducer probe 54 comprises metal parts, and is therefore capable of generating an eddy current in a portion of the ultrasound transducer probe 54 when being exposed to the generated gradient magnetic field. The eddy currents in turn generate magnetic fields that may cause serious problems in MR imaging and may result in image distortions and ghosting effects.

The digital data storage unit 30 comprises a plurality of predetermined parameter sets that are usable for modifying the temporal predetermined electrical current profile so as to compensate for the magnetic effects of the generated eddy currents. The magnetic resonance imaging system 10 is configured for modifying the predetermined electrical current profile on the basis of at least one predetermined parameter set of the plurality of predetermined parameter sets upon receipt of an information indicative of a presence of the additional device 50 formed by the FUS therapy device within the inner region 44, as will be described hereinafter.

Figure 2:
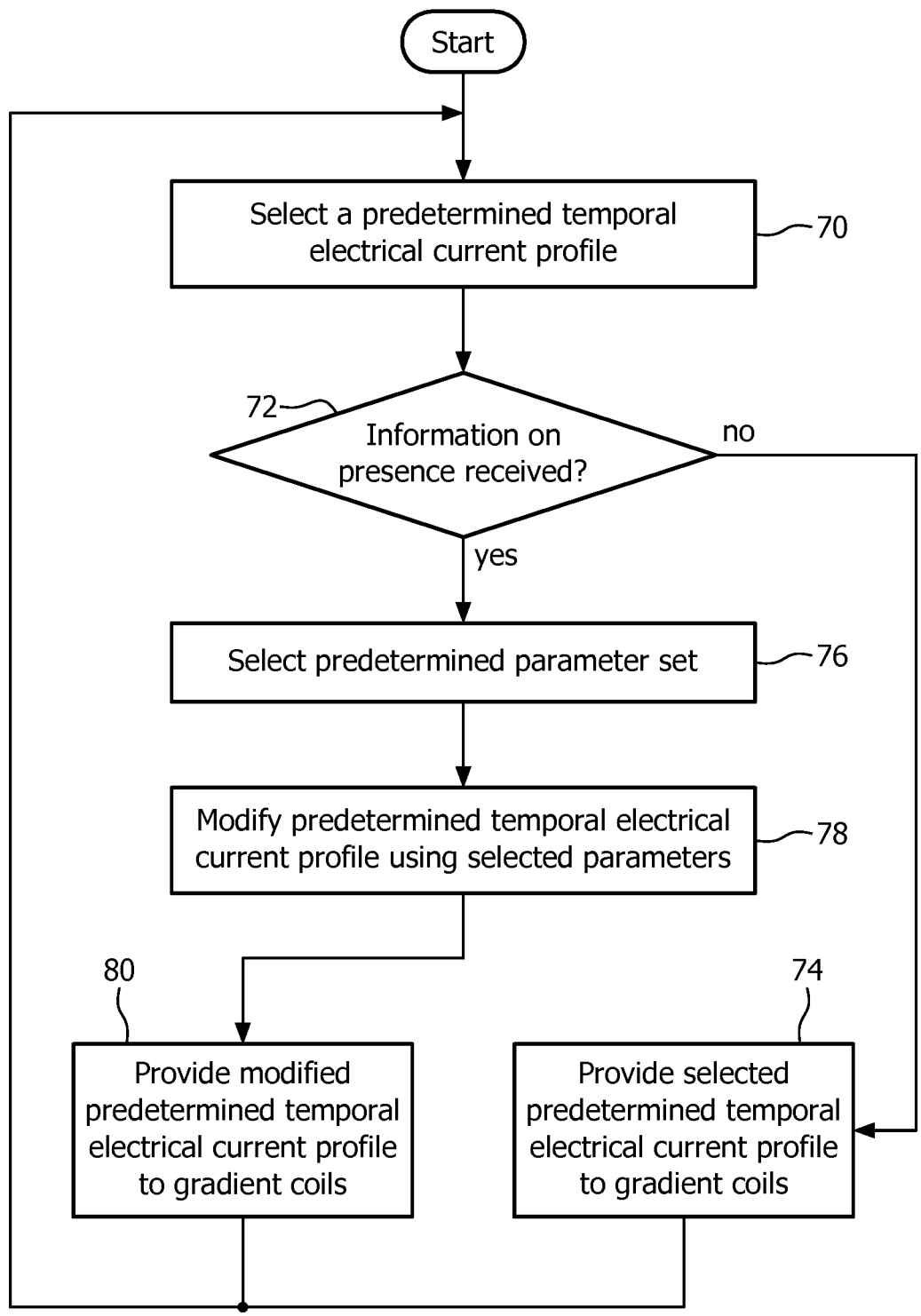
FIG. 2 illustrates a flow chart of an embodiment of a method in accordance with the invention of operating the magnetic resonance imaging system pursuant to FIG. 1 with regard to generating a gradient magnetic field.

In the following, an embodiment of a method of operating the magnetic resonance imaging system 10 with regard to generating a gradient magnetic field in accordance with the invention is described. A flow chart of the method is given in FIG. 2. It shall be understood that all involved units and devices are in an operational state and configured as illustrated in FIG. 1.

In order to be able to carry out parts of the method, the control unit 26 comprises a software module 56 (FIG. 1). The method steps to be conducted are converted into a program code of the software module 56, wherein the program code is implemented in the digital data storage unit 30 of the control unit 26 and is executable by the processor unit 32 of the control unit 26.

Figure 3:
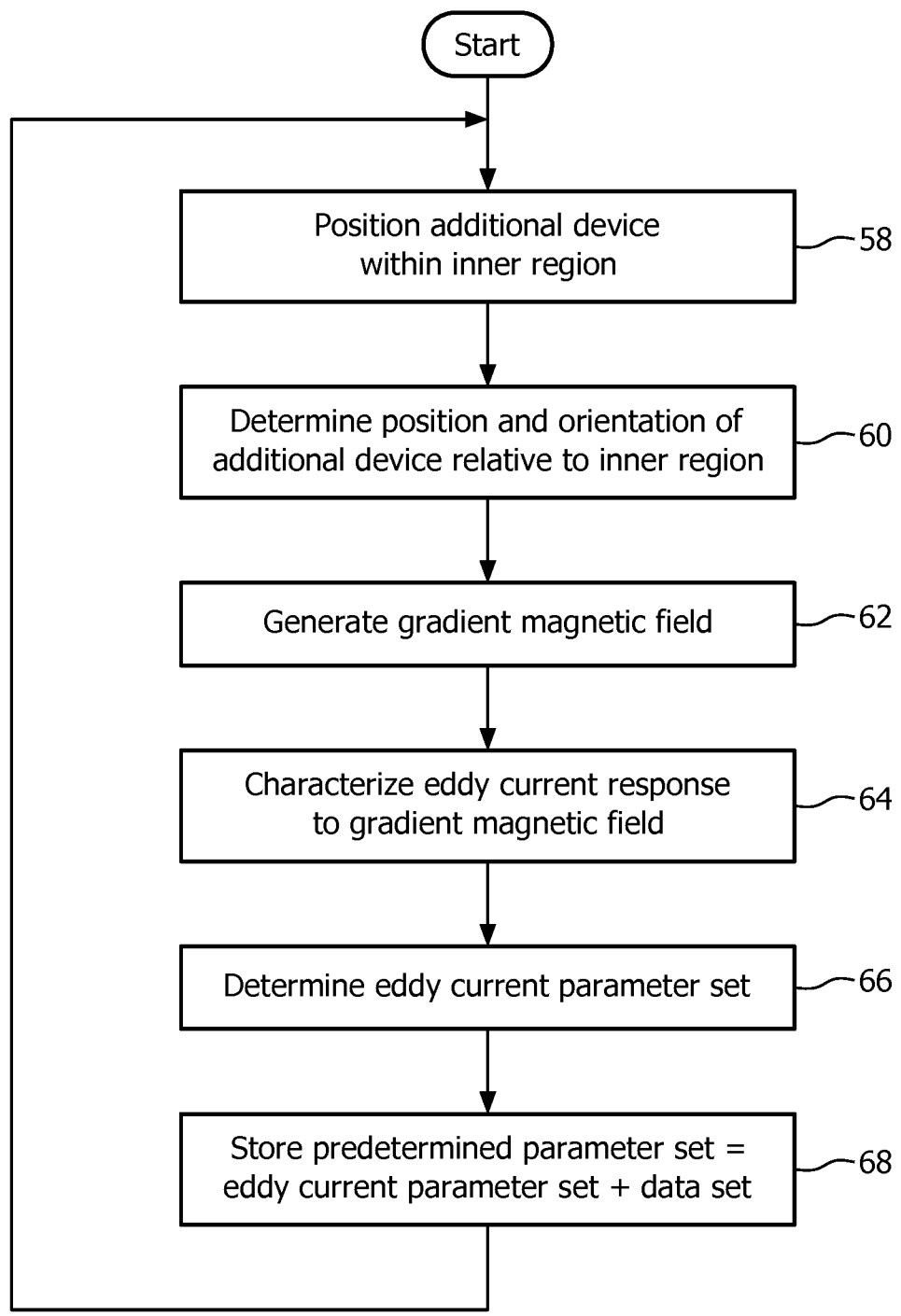
FIG. 3 illustrates a flow chart of preceding steps of the method pursuant to FIG. 2.

In preparation of executing the method in accordance with the invention, following preceding calibration steps are conducted (FIG. 3):

One of additional devices 50, among those the FUS therapy device, is positioned within the inner region 44 of the magnetic resonance imaging system 10 in a first step 58.

Then in a next step 60, a position of the additional device 50 relative to the inner region 44 and an orientation of the additional device 50 relative to the inner region 44 is determined.

In another step 62, a gradient magnetic field is generated by providing a predetermined temporal electrical current profile to the magnetic gradient coils of the magnetic gradient coil system 22.

Next, an eddy current response to the generated gradient magnetic field is characterized in another step 64. To this end, a set of magnetic resonance-active samples is positioned within the inner region 44, and a magnetic resonance imaging procedure is conducted.

In another step 66 that includes evaluating the magnetic resonance signals obtained by the applied magnetic resonance imaging procedure, an eddy current parameter set that is representative of the characterizing of the eddy current response is determined. The eddy current parameter set comprises an eddy current amplitude and an eddy current decay time constant.

In a further step 68, the determined eddy current parameter set, and a data set including the relative position of the additional device 50, the relative orientation and data indicative of the additional device 50 are stored in the digital data storage unit 30 as a new entry of a predetermined parameter set. The data set that is indicative of the additional device 50 includes the manufacturer's name and the exact type designation of the additional device 50. In this way, each one of the predetermined parameter sets is uniquely correlated to a data set that is indicative of the additional device 50 and at least one out of a position and an orientation of the additional device 50 relative to the inner region 44.

The method of operating the magnetic resonance imaging system 10 with regard to generating a gradient magnetic field commences with a step 70 of selecting a predetermined temporal electrical current profile to be provided to the magnetic gradient coils in accordance with a desired magnetic resonance examination mode.

In the next step 72, receipt of information regarding a presence of the additional device 50 formed by the FUS therapy device, in particular a presence of the ultrasound transducer probe 54 within the inner region 44 of the magnetic resonance imaging system 10 is checked for. The step 72 of checking for receipt of information includes checking for information regarding:

the position of the FUS therapy device, in particular the position of the ultrasound transducer probe 54 relative to the inner region 44, the orientation of the FUS therapy device, in particular the orientation of the ultrasound transducer probe 54 relative to the inner region 44, and a type designation and a nature of the additional device 50 formed by the FUS therapy device.

The step 72 of checking is carried out by the control unit 26. The information concerning a presence of the additional device 50 formed by the FUS therapy device within the inner region 44 of the magnetic resonance imaging system 10 can be provided in various ways.

One option for providing the information in this specific embodiment of the magnetic resonance imaging system 10 is a manual input via the human interface device 28, for instance by selecting from a drop down menu that displays selectable options including manufacturer's names, exact type designations of additional devices and position and orientation relative to the inner region. The selection can for instance be carried out by the operator after positioning the additional device 50 within the inner region 44.

Another option for providing the information, which is less subject to human error is to employ detection means for detecting a presence of the additional device 50 formed by the FUS therapy device within the inner region 44, wherein the detection means is configured for providing the information concerning the presence of the FUS therapy device within the inner region 44 to the control unit 26 upon detecting the presence.

In this specific embodiment, the magnetic resonance imaging system 10 is furnished with a detection means formed by a digital optical camera 52. The digital optical camera 52 is directed towards the examination space 16 such that the greater portion of the examination space 16 lies within the field of view of the digital optical camera 52. Output signals of the digital optical camera 52 are transmitted via a wireless data link to the control unit 26 and processed by the signal processing unit 42 of the magnetic resonance imaging system 10 by applying commercially available image recognition software. By that, the position and the orientation of the additional device 50 formed by the FUS therapy device can be determined. Suitable image recognition methods are well known to those skilled in the art and therefore need not be described in more detail herein.

If a result of the step 72 of checking turns out to be negative, i.e. none of the information is received, the predetermined temporal electrical current profile is provided to the magnetic gradient coils in a next step 74.

If the result of the step 72 of checking turns out to be positive, a predetermined parameter set out of the plurality of predetermined parameter sets is selected based on the received information in a next step 76.

In another step 78, the predetermined temporal electrical current profile is modified by using the selected predetermined parameter set.

In a further step 80 then, the modified temporal electrical current profile is provided to the magnetic gradient coils.

The steps 70-80 of the method are periodically executed. In this way, the predetermined temporal electrical current profile is modified for compensating eddy current effects as long as the additional device 50 formed by the FUS therapy device is arranged within the inner region 44. If the additional device 50 is removed from the inner region 44, the provision of the predetermined temporal electrical current profile to the magnetic gradient coils is resumed.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 magnetic resonance imaging system
12 scanner unit
14 main magnet
16 examination space
18 center axis
20 subject of interest
22 magnetic gradient coil system
24 radio frequency transmitter unit
26 control unit
28 human interface device
30 digital data storage unit
32 processor unit
34 radio frequency antenna device (transmit)
36 radio frequency antenna device (receive)
38 radio frequency switching unit
40 radio frequency shield
signal processing unit
44 inner region
46 magnetic gradient coil control unit
48 magnetic gradient coil driver unit
50 additional device
52 digital optical camera
54 ultrasound transducer probe
56 software module steps:
58 position additional device
60 determine position/orientation
62 generate gradient magnetic field
64 characterize eddy current response
66 determine eddy current parameter set
68 store predetermined parameter set
70 select predetermined temporal electrical current profile
72 check receipt of information reg. presence of additional device
74 provide predetermined temporal electrical current profile
76 select predetermined parameter set
78 modify predetermined parameter set
80 provide modified temporal electrical current profile

The invention claimed is:

1. A magnetic resonance imaging system comprising:
a magnetic gradient coil system including
at least one magnetic gradient coil,
at least one magnetic gradient coil driver unit for providing a predetermined temporal electrical current profile to the at least one magnetic gradient coil in accordance with a desired magnetic resonance examination mode, and
a magnetic gradient coil control unit that is configured for controlling the at least one magnetic gradient coil driver unit;
wherein the magnetic gradient coil system is configured for generating gradient magnetic fields to be superimposed to a static magnetic field $B_0$ of the magnetic resonance imaging system;
an inner region defined by a predetermined maximum distance to an outer surface of a smallest virtual cylinder that envelops the at least one magnetic gradient coil;
a digital data storage unit comprising a plurality of predetermined parameter sets that are usable for modifying the predetermined temporal electrical current profile;
the magnetic resonance imaging system being configured for modifying the predetermined temporal electrical current profile at least on the basis of at least one predetermined parameter set of the plurality of predetermined parameter sets upon receipt of an information indicative of a presence of at least one additional device within the inner region, wherein the additional device is capable of generating an eddy current in at least a portion of the additional device when being exposed to the generated gradient magnetic fields;
at least one detection device that is configured for detecting a presence of said additional device within the inner region, and is further configured for providing the information regarding the presence of an additional device within the inner region upon detecting the presence to a control unit of the magnetic resonance imaging system;
the at least one detection device configured to determine at least one out of a position and an orientation of the additional device or the additional devices within the inner region; and
wherein each one of the predetermined parameter sets is uniquely correlated to a data set that is indicative of the at least one additional device and at least one of a position and an orientation of the additional device relative to the inner region.

2. The magnetic resonance imaging system of claim 1, further including a human interface device, wherein the information regarding a presence of the at least one additional device within the inner region is provided to the control unit of the magnetic resonance imaging system via the human interface device.

3. The magnetic resonance imaging system of claim 1, wherein the at least one detection device is formed by an optical camera.

4. A method of operating a magnetic resonance imaging system with regard to generating a gradient magnetic field by at least one magnetic gradient coil of a gradient coil system, the method comprising steps of:
selecting a predetermined electrical current profile to be provided to the at least one magnetic gradient coil in accordance with a desired magnetic resonance examination mode;
checking for receipt of information regarding a presence of an additional device within an inner region of the magnetic resonance imaging system that is defined by a predetermined maximum distance to an outer surface of a virtual cylinder that envelops the at least one magnetic gradient coil;
providing the predetermined electrical current profile to the at least one magnetic gradient coil if a result of the checking turns out to be negative;

if a result of the checking turns out to be positive:
based on the received information, selecting a predetermined parameter set corresponding to the additional device present in the inner region of the magnetic resonance imaging system from a plurality of predetermined parameter sets,
modifying the predetermined electrical current profile by using the selected predetermined parameter set, and
providing the modified electrical current profile to the at least one magnetic gradient coil.

5. The method of claim 4, wherein the step of checking for receipt of information comprises checking for information regarding a position of the additional device relative to the inner region, an orientation of the additional device relative to the inner region, and a type and a nature of the additional device.

6. The method of claim 4, further comprising preceding calibration steps of:
positioning the additional device within the inner region of the magnetic resonance imaging system;
determining at least one out of a position of the additional device relative to the inner region and an orientation of the additional device relative to the inner region;
generating a gradient magnetic field by providing the predetermined electrical current profile to the magnet gradient coil or the magnetic gradient coils of the magnetic resonance imaging system;
characterizing an eddy current response to the generated gradient magnetic field;
determining an eddy current parameter set that is representative of the characterizing of the eddy current response;
storing the determined eddy current parameter set, and a data set including the position of the additional device, the relative orientation and data indicative of the additional device as a predetermined parameter set in a digital data storage unit.

7. The method of claim 6, wherein the step of characterizing the eddy current response includes steps of:
positioning a set of magnetic resonance-active samples within the inner region;
applying a magnetic resonance imaging procedure; and
the step of determining the eddy current parameter set includes evaluating the magnetic resonance signals obtained by the applied magnetic resonance imaging procedure.

8. A software module for carrying out the method of claim 4, wherein the method steps to be conducted are converted into a program code of the software module, wherein the program code is implementable in a non-transitory computer readable medium of the MR imaging system and is executable by a processor unit of the MR imaging system.

9. A magnetic resonance imaging system which includes one or more non-transitory computer readable memories configured to store pulse sequences including gradient pulse profiles and one or more processors configured to modify the gradient pulse profiles to compensate for eddy currents and supply the modified gradient pulse profiles to one or more gradient coil drivers, the magnetic resonance imaging system being adapted to receive one or more of a plurality of additional devices, wherein the improvement comprises:
the one or more memories being configured to store a plurality of parameter sets configured to modify the gradient pulse profiles, each parameter set corresponding to one of the additional devices;
one or more detection devices configured to sense presence, position, and orientation of one or more of the additional devices in an imaging region of the magnetic resonance imaging system;
the one or more processors being configured to receive an identification of the one or more additional devices present in the imaging region, select one or more of the plurality of parameter sets corresponding to the one or more present additional devices, receive the sensed positions and orientations of the one or more additional devices, and further modify the gradient pulse profiles on the basis of the received one or more parameter sets, the received positions, and the received orientations, magnetic resonance imaging being conducted using the further modified gradient pulse profiles.

* * * * *